(12) United States Patent
Xie et al.

(10) Patent No.: US 7,578,678 B2
(45) Date of Patent: Aug. 25, 2009

(54) PROTECTED SOCKET FOR INTEGRATED CIRCUIT DEVICES

(75) Inventors: Hong Xie, Phoenix, AZ (US); Bob Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/948,624

(22) Filed: Nov. 30, 2007

(65) Prior Publication Data

US 2008/0085615 A1  Apr. 10, 2008

Related U.S. Application Data

(62) Division of application No. 10/973,328, filed on Oct. 25, 2004, now Pat. No. 7,316,573.

(51) Int. Cl.
   *H01R 12/00* (2006.01)
(52) U.S. Cl. .......................... 439/71; 439/378
(58) Field of Classification Search .................. 439/70, 439/71, 374, 378
   See application file for complete search history.

(56) References Cited

U.S. PATENT DOCUMENTS

| | | | | |
|---|---|---|---|---|
| 3,771,109 A | * | 11/1973 | Bruckner et al. | 439/331 |
| 3,873,173 A | * | 3/1975 | Anhalt | 439/71 |
| 3,993,384 A | * | 11/1976 | Dennis et al. | 439/71 |
| 3,999,827 A | * | 12/1976 | Hutchison et al. | 439/71 |
| 4,340,266 A | * | 7/1982 | Grovender | 439/71 |
| 4,832,612 A | * | 5/1989 | Grabbe et al. | 439/71 |
| 5,032,088 A | * | 7/1991 | Kuramitsu | 439/378 |
| 5,057,904 A | * | 10/1991 | Nagato et al. | 257/693 |
| 5,131,852 A | * | 7/1992 | Grabbe et al. | 439/71 |
| 5,155,905 A | * | 10/1992 | Miller, Jr. | 29/843 |
| 5,208,529 A | * | 5/1993 | Tsurishima et al. | 324/754 |
| 5,410,258 A | * | 4/1995 | Bowers et al. | 324/755 |
| 5,518,410 A | | 5/1996 | Masami | |
| 5,727,954 A | | 3/1998 | Kato et al. | |
| 5,955,888 A | | 9/1999 | Frederickson et al. | |
| 6,062,873 A | | 5/2000 | Kato | |
| 6,231,353 B1 | * | 5/2001 | Rathburn | 439/66 |
| 6,287,127 B1 | * | 9/2001 | Hibino et al. | 439/70 |
| 6,292,003 B1 | | 9/2001 | Frederickson et al. | |
| 6,300,781 B1 | * | 10/2001 | Yap et al. | 324/755 |
| 6,439,897 B1 | * | 8/2002 | Ikeya | 439/73 |
| 6,666,691 B2 | | 12/2003 | Ikeya | |
| 6,749,441 B1 | | 6/2004 | Ma | |
| 6,749,443 B2 | | 6/2004 | Sano et al. | |
| 6,863,541 B2 | | 3/2005 | Kagami | |
| 6,875,025 B2 | | 4/2005 | Hsu et al. | |
| 6,913,468 B2 | | 7/2005 | Dozier, II et al. | |
| 6,948,945 B2 | | 9/2005 | Chen et al. | |
| 6,958,616 B1 | | 10/2005 | Mahoney et al. | |
| 6,969,266 B2 | * | 11/2005 | Chu et al. | 439/70 |

* cited by examiner

*Primary Examiner*—Tho D Ta
(74) *Attorney, Agent, or Firm*—Konrad Raynes & Victor LLP

(57) ABSTRACT

Provided are a method, device and system in which, in one embodiment, a socket for an integrated circuit package includes a standoff adapted to engage and support the package in a first position in which the package contact terminals are disengaged from socket contact terminals. The standoff is adapted to move to a second position in which the package contact terminals are engaged with the socket contact terminals. In another embodiment, male and female alignment members guide package contact terminals into engagement with socket contact terminals.

16 Claims, 10 Drawing Sheets

PROTECTED SOCKET FOR INTEGRATED CIRCUIT DEVICES

RELATED CASES

This application is a divisional application of pending application Ser. No. 10/973,328, filed Oct. 25, 2004, which is incorporated by reference in its entirety.

BACKGROUND

Description of Related Art

Integrated circuits typically include various active and passive circuit elements which have been integrated into a piece of semiconductor material, often referred to as a die. The die may, in turn, be fully or partially encapsulated into a package, which often includes an organic, ceramic or plastic substrate although other materials may be used. The package mechanically supports and protects the die which is often relatively fragile.

These packages are usually attached to a printed circuit board, often by connectors arranged along the exterior of the package. The package may be attached directly to the printed circuit board, often by soldering or other connection techniques. In some applications, the package may not connect directly to the printed circuit board. Instead, an interposer or socket or other device may provide an intermediate connection between the package and the printed circuit board.

The exterior connectors of the package typically provide separate electrical connection terminals between the printed circuit board (or interposer or socket), and the various inputs and outputs of the integrated circuit or circuits within the package. An integrated circuit die often has electrical connectors such as solder bumps to mechanically and electrically connect the integrated circuit die to the package substrate. In this manner, an electronic system can be formed by connecting various integrated circuit packages to a printed circuit board.

FIG. 1a is a schematic cross-sectional view of a prior art socket 10 for an integrated circuit package 12 which contains one or more integrated circuit dies as represented by an integrated circuit die 14 (FIG. 1c). The integrated circuit die 14 may be encapsulated within the package 12 by a suitable encapsulation layer 15, for example.

The socket 10 includes a plurality of electrical contact terminals 16 which are positioned to be engaged by corresponding electrical contact pads or lands 18 of the integrated circuit package 12 as shown in FIG. 1b. The electrical contact lands 18 are in turn connected to the integrated circuit die 14 by various connectors of the substrate 21 of the package 12 including solder bumps 22.

The socket 10 is attached to a printed circuit board 20 which has connectors electrically connected to the electrical contact terminals 16 of the socket 10 as well as the electrical contact terminals of other sockets and other integrated circuit packages to form an electronic system. The socket 10 may have a protective cover 24 (FIG. 1a) which is typically removed prior to insertion of the package 12 into the socket 10. The socket 10 often has a lever (not shown) which may be pivoted to push the package 12 into the socket 10 to the engaged position shown in FIG. 1b.

BRIEF DESCRIPTION OF THE DRAWINGS

Referring now to the drawings in which like reference numbers represent corresponding parts throughout:

FIG. 8 is a schematic top view of the socket of FIG. 7a;

FIG. 9c is a schematic side view of the socket of FIG. 9a;

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 1A:
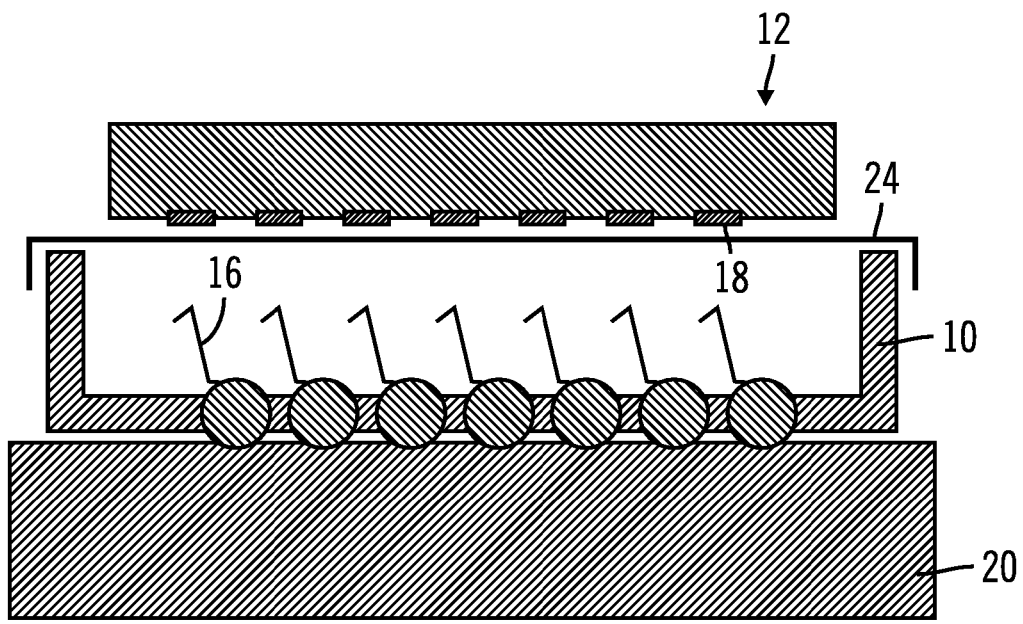
FIGS. 1a and 1b are schematic cross-sections illustrating a prior art integrated circuit package being inserted into a prior art socket carried on a printed circuit board.
Figure 1B:
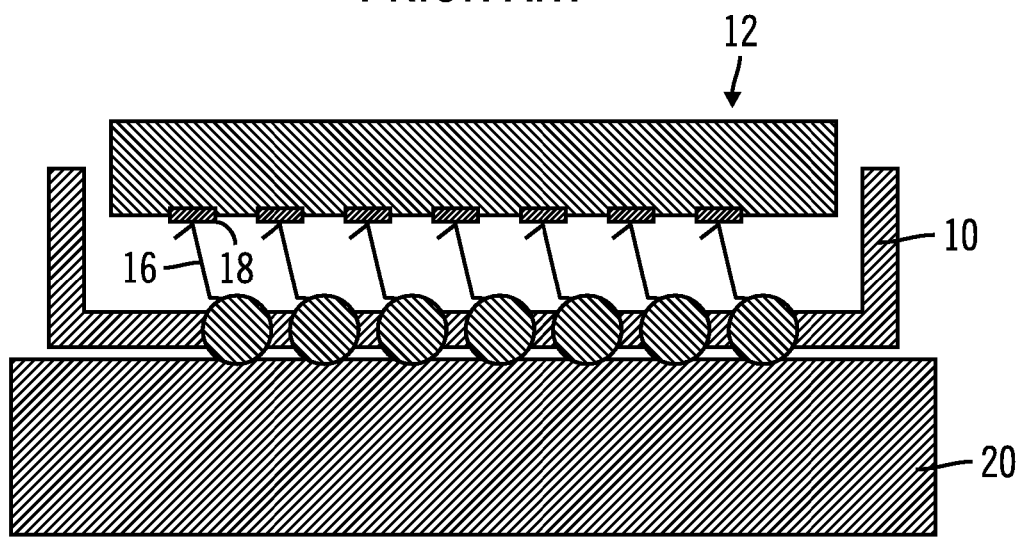
Figure 1C:
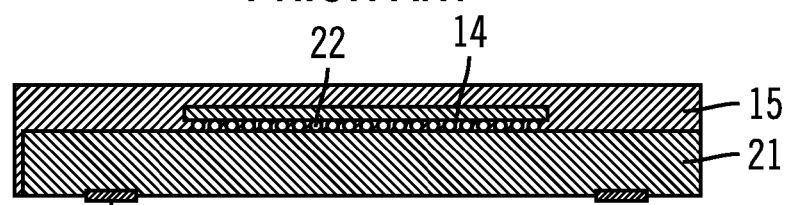
FIG. 1c is a schematic cross-sectional view of a prior art integrated circuit package.
Figure 2:
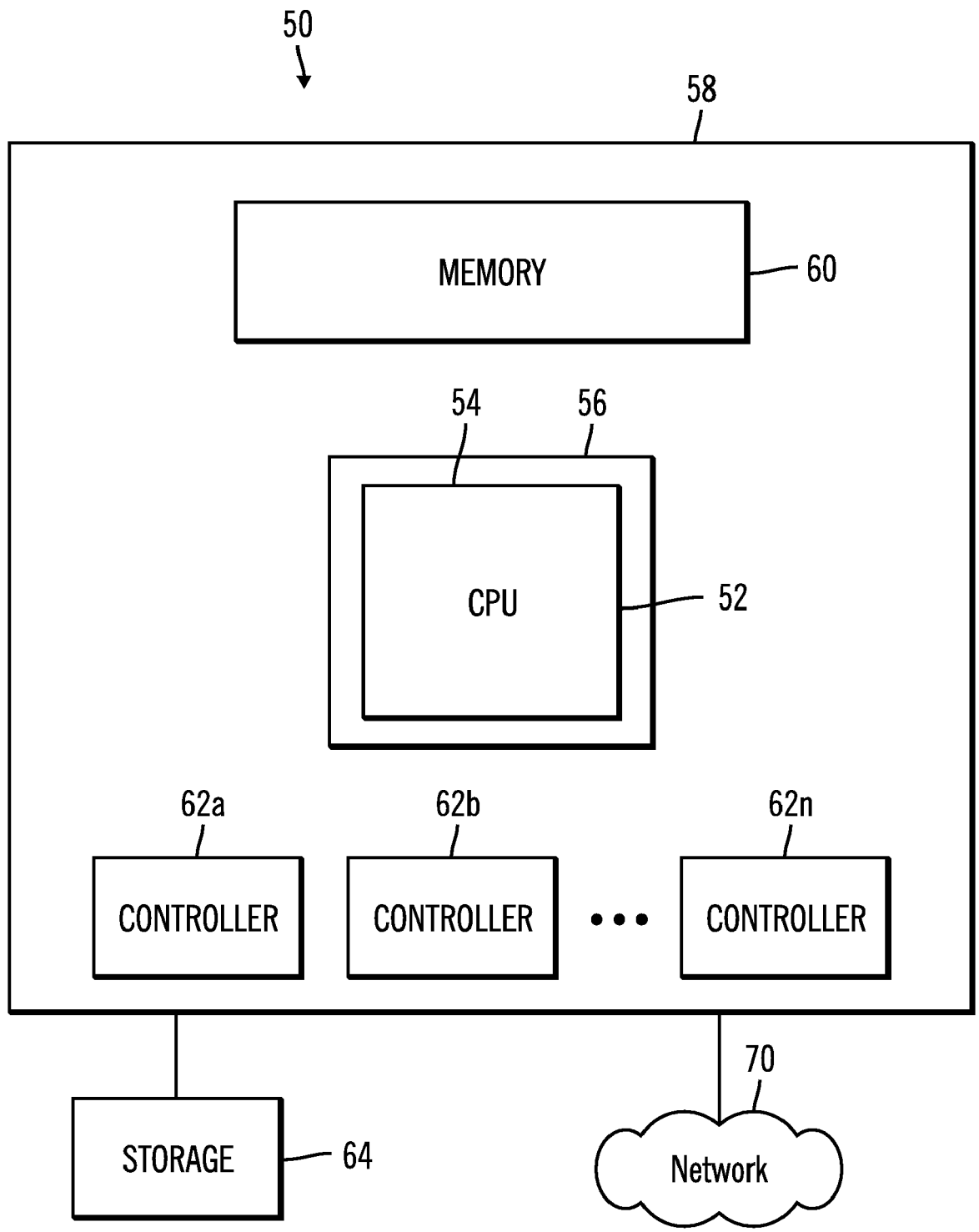
FIG. 2 illustrates one embodiment of a computing environment in which aspects of the description provided herein are embodied.

FIG. 2 illustrates a computing environment in which aspects of described embodiments may be embodied. A computer 50 includes one or more central processing units (CPU) 52 (only one is shown). In this embodiment, the CPU 52, also referred to as a microprocessor, is packaged in an integrated circuit package 54 seated in a socket 56 disposed on a printed circuit board 58, which in this embodiment, is a motherboard. The integrated circuit package 54 itself may be similar to the integrated circuit package 12 depicted in FIG. 1c.

The computer 50 further includes memory 60 and a plurality of controllers 62a, 62b . . . 62n which are also disposed on the motherboard 58. The motherboard 58 may be a single layer or multi-layered board which has a plurality of conductive lines that provide communication between the circuits in the package 54 and other components mounted to the board 58. Alternatively, one or more of the CPU 52, memory 60 and controllers 62a, 62b . . . 62n may be disposed on other cards such as daughter cards or expansion cards. The CPU 52, memory 60 and controllers 62a, 62b . . . 62n may each be seated in individual sockets or may be connected directly to a printed circuit board.

An operating system and various applications execute on the CPU 52 and reside in the memory 60. The content residing in memory 60 may be cached in accordance with known caching techniques. Programs and data in memory 60 may be swapped into storage 64 as part of memory management operations. The computer 50 may comprise any computing device known in the art, such as a mainframe, server, personal computer, workstation, laptop, handheld computer, telephony device, network appliance, virtualization device, storage controller, network controller, etc. Any CPU 52 and operating system known in the art may be used.

The controllers 62a, 62b . . . 62n may include a system controller, peripheral controller, memory controller, hub controller, I/O bus controller, video controller, network controller, storage controller, etc. For example, a storage controller can control the reading of data from and the writing of data to the storage 64 in accordance with a storage protocol layer. The storage protocol of the layer may be any of a number of known storage protocols. Data being written to or read from the storage 62 may be cached in accordance with known caching techniques.

A network controller can include one or more protocol layers to send and receive network packets to and from remote devices over a network 70. The network 70 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art.

FIGS. 3a-3c and 4 show an example of operations for inserting an integrated circuit package, such as a package 54 into a socket such as the socket 56 disposed on a printed circuit board such as the motherboard 58. As explained in greater detail below, the socket 56 has a platform or standoff 104 which may be engaged by the integrated circuit package 54 to facilitate insertion of the package 54 into the socket 56. It is appreciated that a socket such as the socket 56 may be suitable for packages for other types of integrated circuits in addition to microprocessors, such as one or more of the controllers 62a, 62b . . . 62n.

Figure 5:
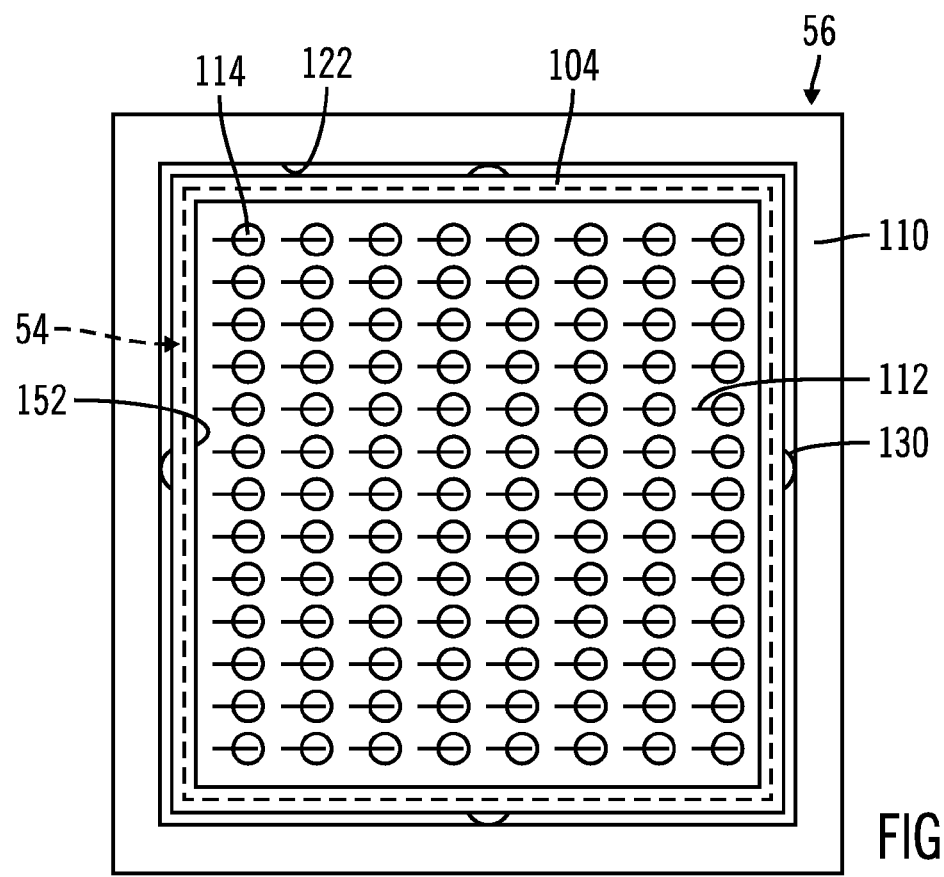
FIG. 5 is a schematic top view of a socket in accordance with one aspect of the present disclosure.

As best seen in FIG. 5, the socket 56 includes a housing 110 which is generally rectangular in shape and may be formed of an electrically insulative material such as a thermoplastic. It is appreciated that the socket housing 110 may have other shapes, and may be made of a variety of other materials, either conductive or insulative, depending upon the particular application.

Disposed within the socket housing 110 is an array of electrically conductive contact terminals 112, each of which is supported at one end by an electrically conductive base terminal 114 of the socket housing 110. In the illustrated embodiment, each socket contact terminal 112 is a resilient conductor having a contact face 116 disposed at the free end of each contact terminal 112. Each base terminal 114 electrically connects a socket contact terminal 112 to a conductor of a printed circuit board 58 supporting the socket 56. It is appreciated that the contact terminals 112 and the base terminals 114 may have a variety of shapes and forms including wires, leafs, receptacles, pads, pins, bumps, lands, etc. It is further appreciated that the contact and base terminals may be positioned within the socket housing 110 in a variety of positions including regular rectangular grid arrays as depicted in FIG. 5 as well as other patterns and irregular distributions as well.

In the embodiment of FIGS. 3a-3c and 5, the standoff 104 is positioned within a generally rectangular aperture 122 defined by the socket housing 110. The standoff 104 is also generally rectangular in shape and conforms generally to the shape of the housing aperture 122. Here too, it is appreciated that the socket housing aperture 122 and the standoff 104 may have other shapes, depending upon the particular application.

In the illustrated embodiment, the standoff 104 is formed of the same material as the housing 110 such as a thermoplastic, for example. It is appreciated that the standoff 104 may be formed of a variety of other materials, either conductive or insulative, depending upon the particular application.

Figure 3A:
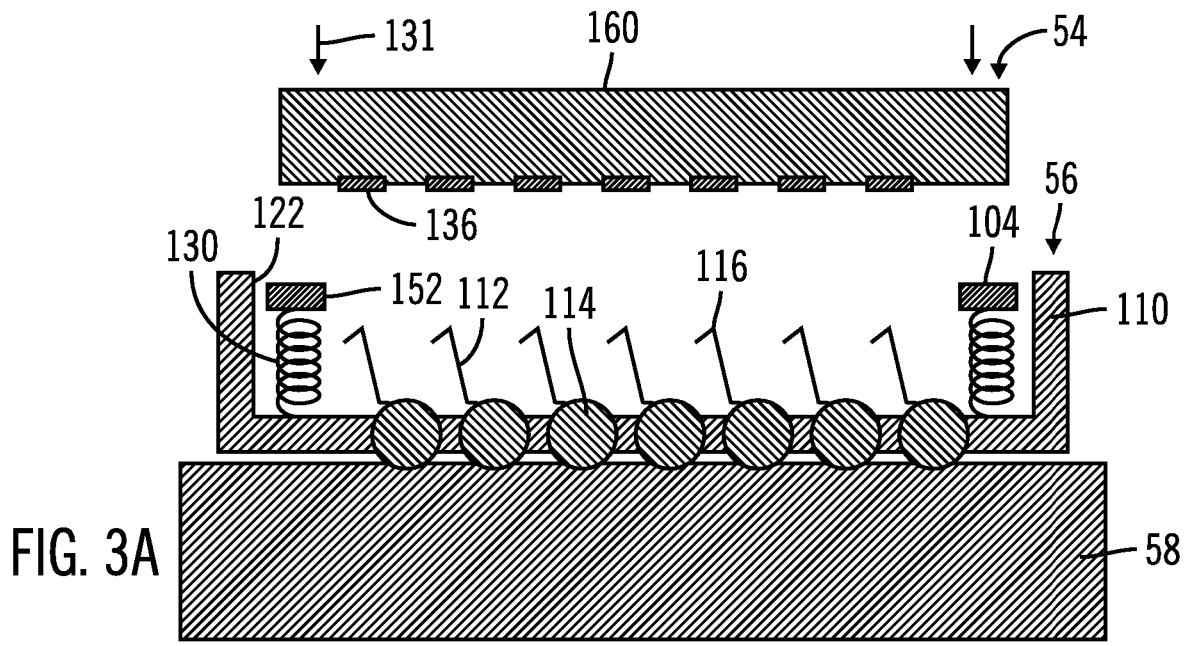
FIGS. 3a, 3b and 3c are schematic cross-sections illustrating operations in which an integrated circuit package is inserted into a socket in accordance with one aspect of the present disclosure.

Also in this embodiment, the standoff 104 is supported within the housing 110 by one or more resilient members 130 disposed about the periphery of the housing aperture 122. The resilient members 130 are positioned to bias the standoff 104 in the position of FIG. 3b and to exert a spring force against the standoff 104 as the standoff 104 is moved to a second position as shown in FIG. 3c. In this example, the resilient members 130 include helix-shaped springs.

Figure 3B:
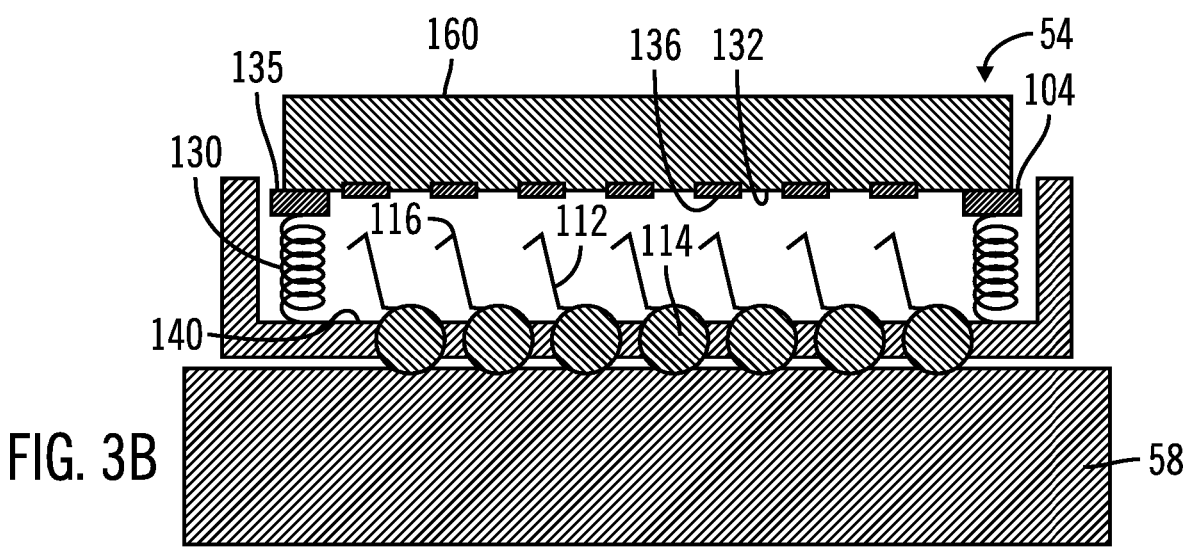
Figure 3C:
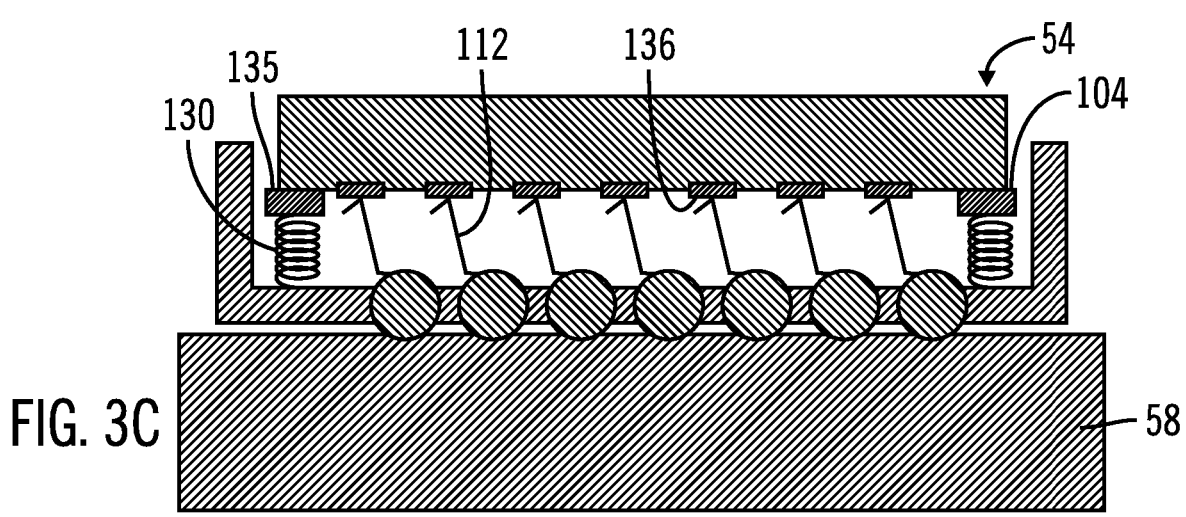

To insert an integrated circuit package such as the package 54 into the socket 56, in a first operation, the package 54 is moved toward the socket in a direction represented by arrows 131 until a face or bottom surface 132 of the package 54 engages (block 134, FIG. 4) a top surface 135 of the standoff 104 in the first standoff position illustrated in FIG. 3b. In one aspect of this embodiment of the present disclosure, the integrated circuit package 54 may be supported by the standoff 104 in this first standoff position, such that the contact terminals 112 of the socket 56 and corresponding contact terminals 136 of the integrated circuit package 54 remain substantially disengaged.

In another aspect, the standoff 104 may align the integrated circuit package 54 with respect to the socket contact terminals 112 prior to substantial contact between the socket contact terminals 112 and the package contact terminals 136. For example, the face 132 of the integrated circuit package 54 is depicted in FIG. 3b as being relatively parallel to an opposing face 140 of the housing 110, when the package 54 is supported by the standoff 104 in the first standoff position. In addition, the contact terminals 136 are depicted in FIG. 3b as being substantially aligned for subsequent engagement with corresponding socket contact terminals 112 as motion of the package 54 in the direction represented by the arrows 131 continues.

The package 54 may be placed on the standoff 104 of the socket 56 by a human or automated assembler. In the illustrated embodiment, the resilient members 130 have sufficient resiliency to support the weight of the standoff 104 and the package 54 in the first position depicted in FIG. 3b. In this manner, contact between the socket contact terminals 112 and the package contact terminals 136 may be delayed until an appropriate alignment between the package 54 and the socket 56 has been achieved.

It is appreciated that the resiliency provided by the resilient members may vary depending upon the particular application. For example, in one application, the resilient members may have sufficient strength to support the weight of the standoff 104 and the package 54 indefinitely. In another application, for example, the resilient members may have sufficient strength merely to delay contact between the socket contact terminals 112 and the package contact terminals 136 until an appropriate alignment between the package 54 and the socket 56 has been achieved.

In another operation, the standoff 104 is moved (block 150, FIG. 4) to a second position in which the package contact terminals 136 are engaged with the socket contact terminals 112 as shown in FIG. 3c. In the illustrated embodiment, the standoff 104 is moved from the first position to the second standoff position by moving the package 54 and hence the standoff 104 as well in the direction of contact engagement as represented by the arrows 131. As the package 54 moves closer to the contact terminals 112 of the socket 56, the resilient members 130 compress, resisting the movement of the standoff 104. In addition, the socket contact terminals 112 extend through a central aperture 152 defined by the standoff 104. The package 54 may be moved to move the package contact terminals 136 into contact with socket contact terminals 112 using a variety of techniques known to those skilled in the integrated circuit assembly art.

For example, a human or automated assembler can apply pressure to the top surface 160 of the package 54 to press the package 54 and the standoff 104 from the first standoff position depicted in FIG. 3b to the second standoff position depicted in FIG. 3c. In one embodiment, a lever arm connected to the socket 56 may be pivoted by a human or automated assembler to press the package 54 to the engaged position depicted in FIG. 3c and latch it in this position. Other techniques may be used to press and latch the package 54 in the engaged position of FIG. 3c as well. The resiliency of the resilient members 130 may be selected such that the force applied by the human or automated assembler may readily overcome the resistance exerted by the resilient members 130 to motion in the direction represented by the arrows 131. In another embodiment, the weight of the package 54 may be sufficient to move the package 54 to the engaged position depicted in FIG. 3c by the force of gravity without additional applied force.

In the illustrated embodiment, the package contact terminals 136 are depicted as lands arranged in a grid array. It is appreciated that the contact terminals 136 may be conductors having a variety of shapes and forms including wires, leafs, receptacles, pads, pins, bumps, etc. In addition the contact terminals 136 may be arranged in a variety of positions including regular rectangular grid arrays as well as other patterns and irregular distributions as well.

Figure 6:
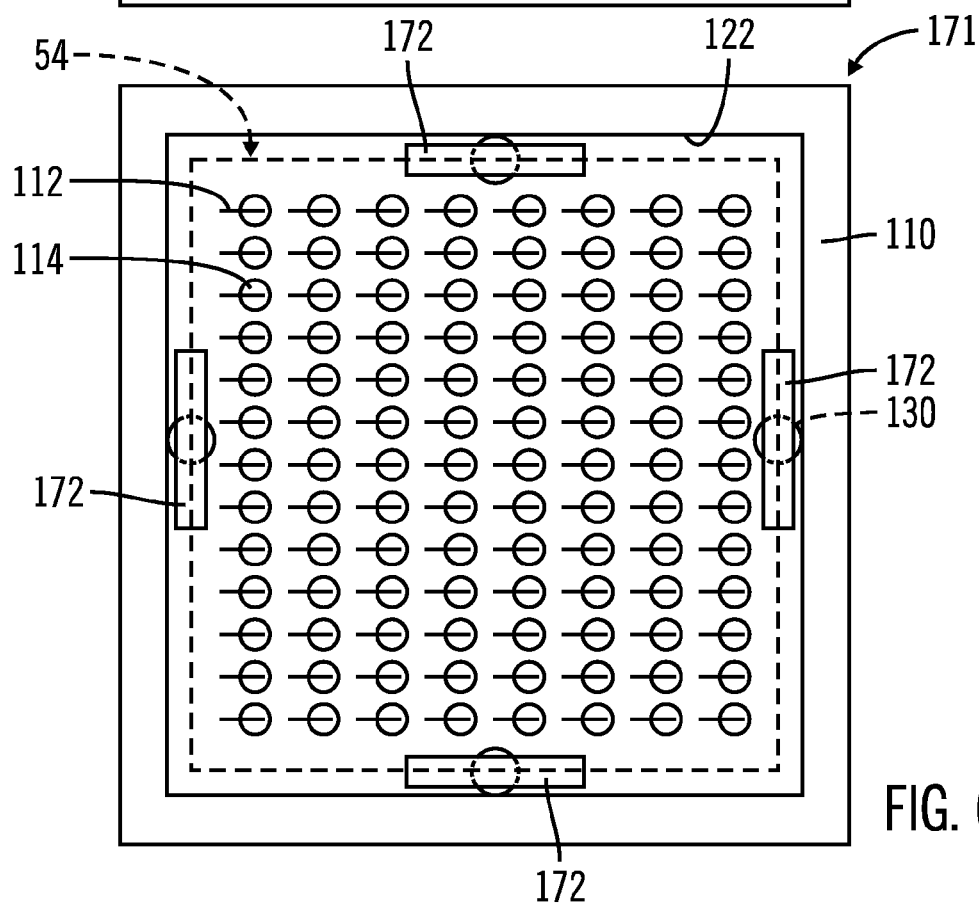
FIG. 6 is a schematic top view of a socket in accordance with another embodiment of the present disclosure.

In the embodiment of FIG. 5, the standoff 104 is shaped in general similar to an annular or picture frame. It is appreciated that the standoff 104 may have other shapes. For example, FIG. 6 illustrates another embodiment in which a standoff of a socket 171 includes one or more tab members 172 disposed about the periphery of the housing aperture 122. The tab members 172 are positioned to support a package 54 in a first standoff position in a manner similar to that depicted for the standoff 104 in FIG. 3b. Each standoff tab member 172 may be resiliently supported by a resilient member 130 to permit each standoff tab member 172 to be moved to a second position in which the package contact terminals 136 contact the socket contact terminals 112 in a manner similar to that depicted in FIG. 3c.

Figure 7A:
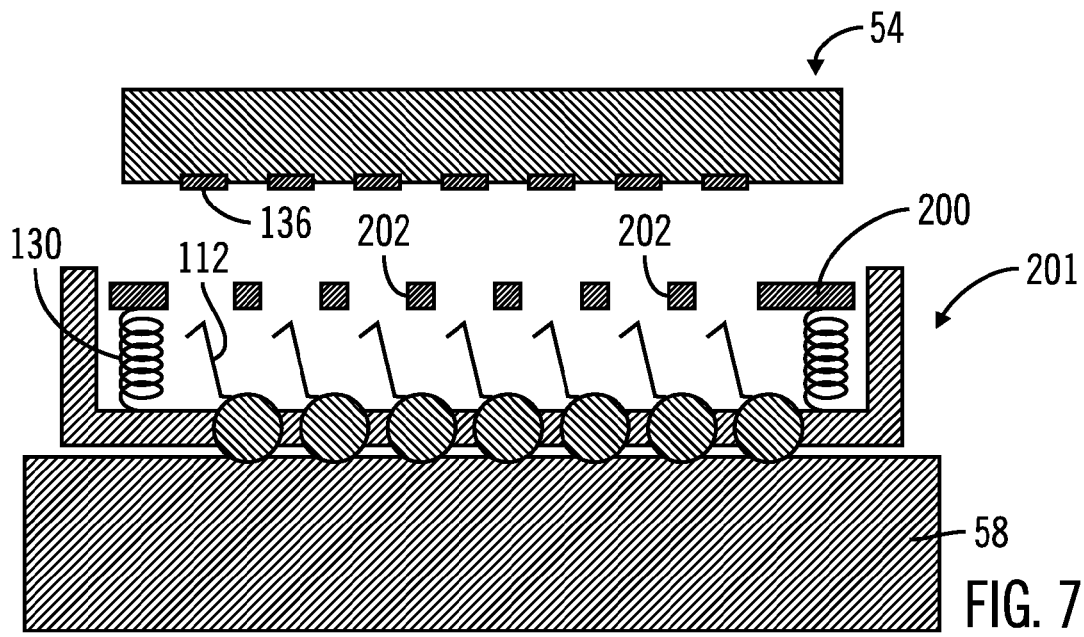
FIGS. 7a, 7b and 7c are schematic cross-sections illustrating operations in which an integrated circuit package is inserted into a socket in accordance with still another embodiment of the present disclosure.
Figure 7B:
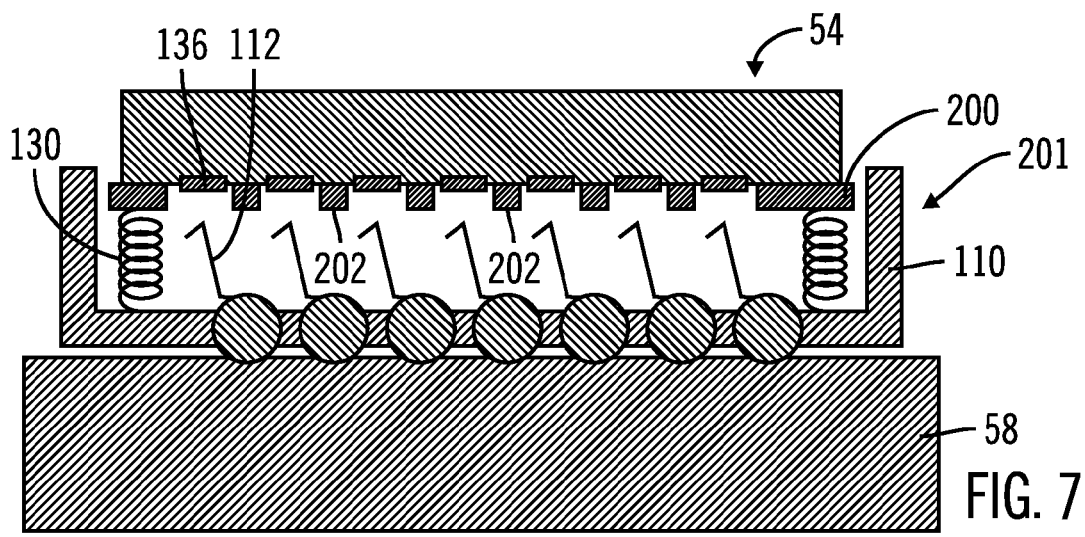

FIGS. 7a-7c and 8 illustrate a standoff 200 having yet another shape. In this embodiment, the standoff 200 of a socket 201 is shaped as a cover member which defines a plurality of apertures 202. Each standoff aperture 202 is positioned in alignment with a package contact terminal 136. Thus, as the package 54 is moved to engage the standoff 200, each standoff aperture 202 is positioned to receive a package contact terminal 136 as shown in FIG. 7b.

Figure 7C:
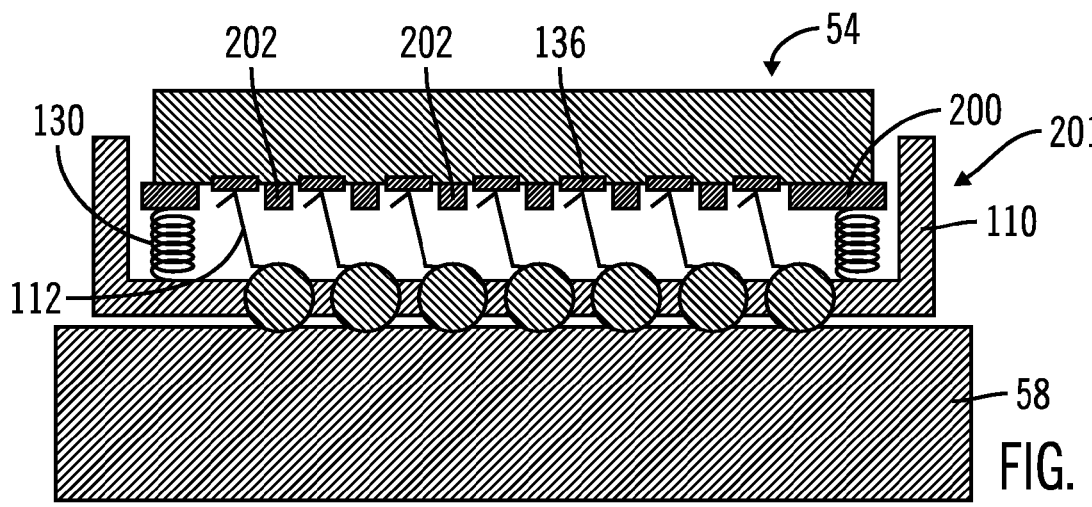
Figure 4:
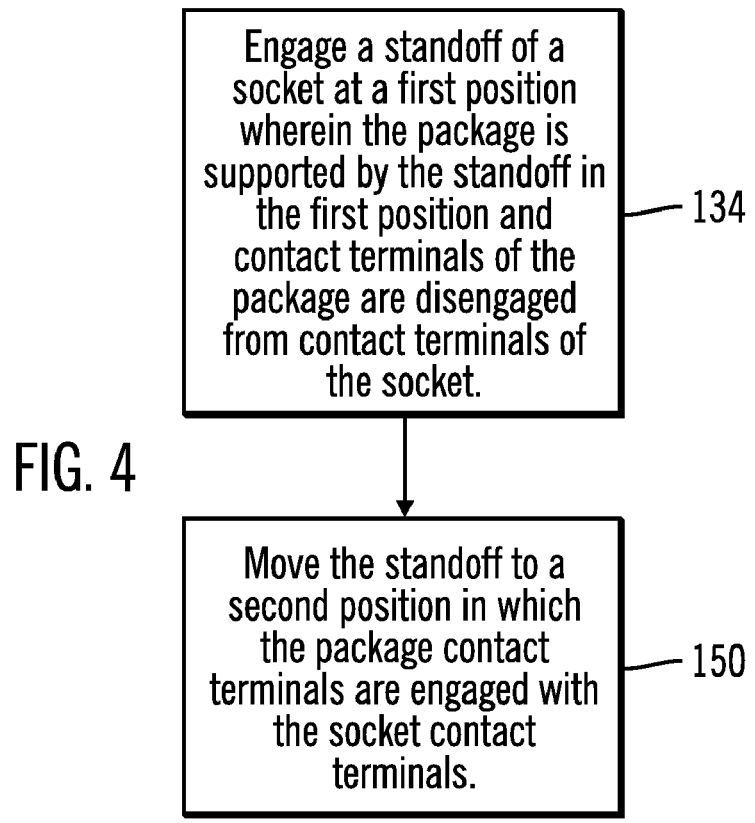
FIG. 4 illustrates one example of operations to insert an integrated circuit package into a socket in accordance with one aspect of the present disclosure.
Figure 8:
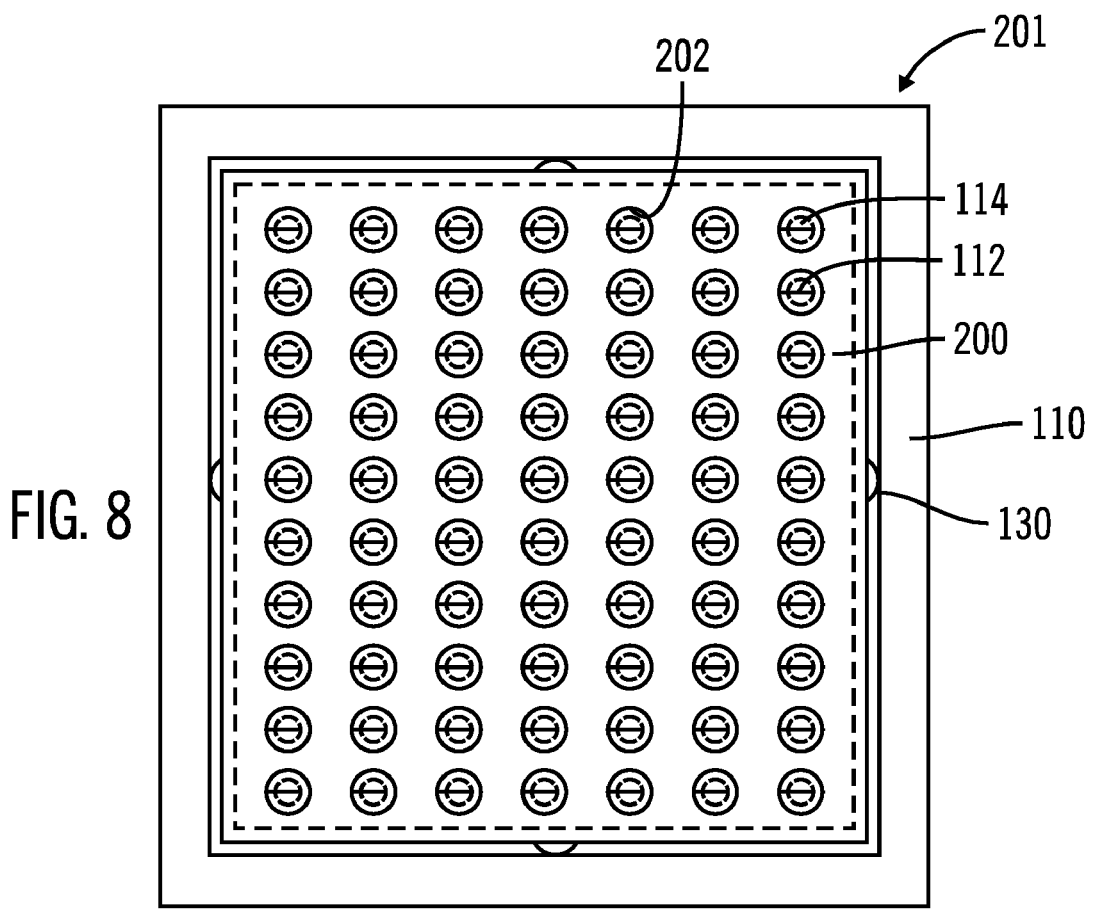

In addition, as shown in FIGS. 7a-7c and 8, each standoff aperture 202 is also positioned in alignment with a socket contact terminal 112. Thus, as the package 54 and the standoff 200 are moved from the first standoff position of FIG. 7b to the second standoff position of FIG. 7c, each standoff aperture 202 is positioned to receive a socket contact terminal 112 as shown in FIG. 7c. In this position, each package contact terminal 136 can engage a corresponding socket contact terminal 112 through a corresponding standoff aperture 202.

In the illustrated embodiments of FIGS. 3-8, the resilient members 130 include helix-shaped springs. It is appreciated that the resilient members 130 may include springs having other shapes including leaf springs and spiral shaped springs. The resilient members may be made of a variety of materials including metals, plastics and resilient, compressible or stretchable solids such as latex.

Figure 9A:
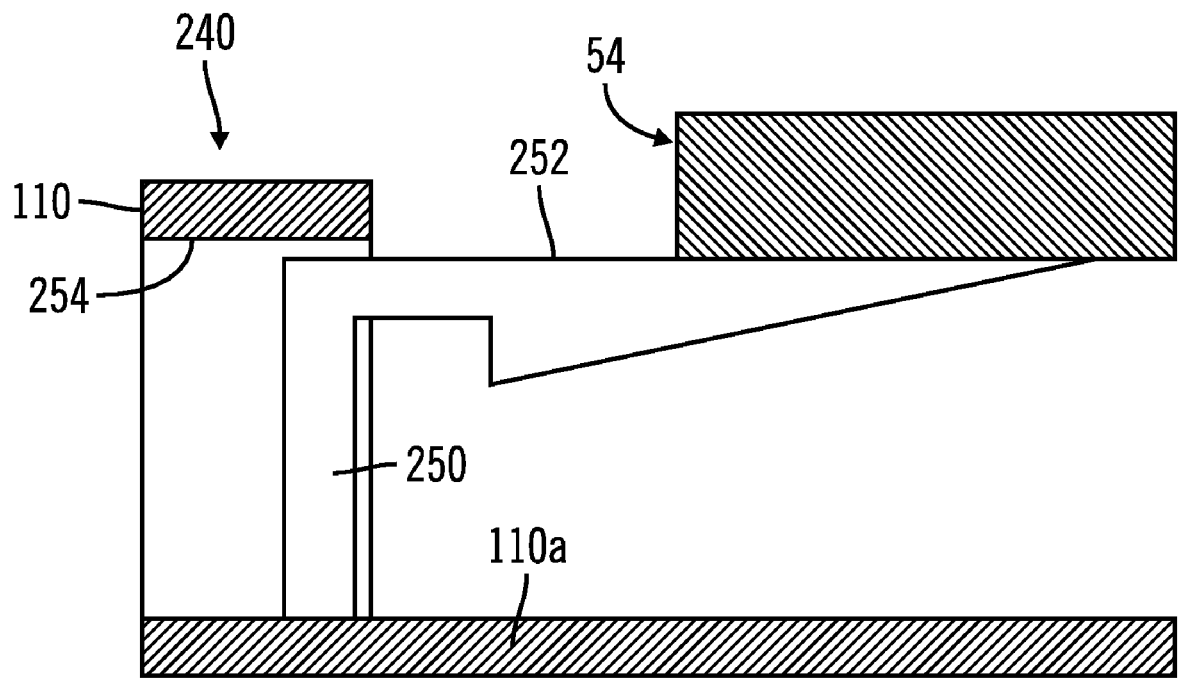
FIGS. 9a and 9b are schematic cross-sections illustrating operations in which an integrated circuit package is inserted into a socket in accordance with yet another embodiment of the present disclosure.
Figure 9B:
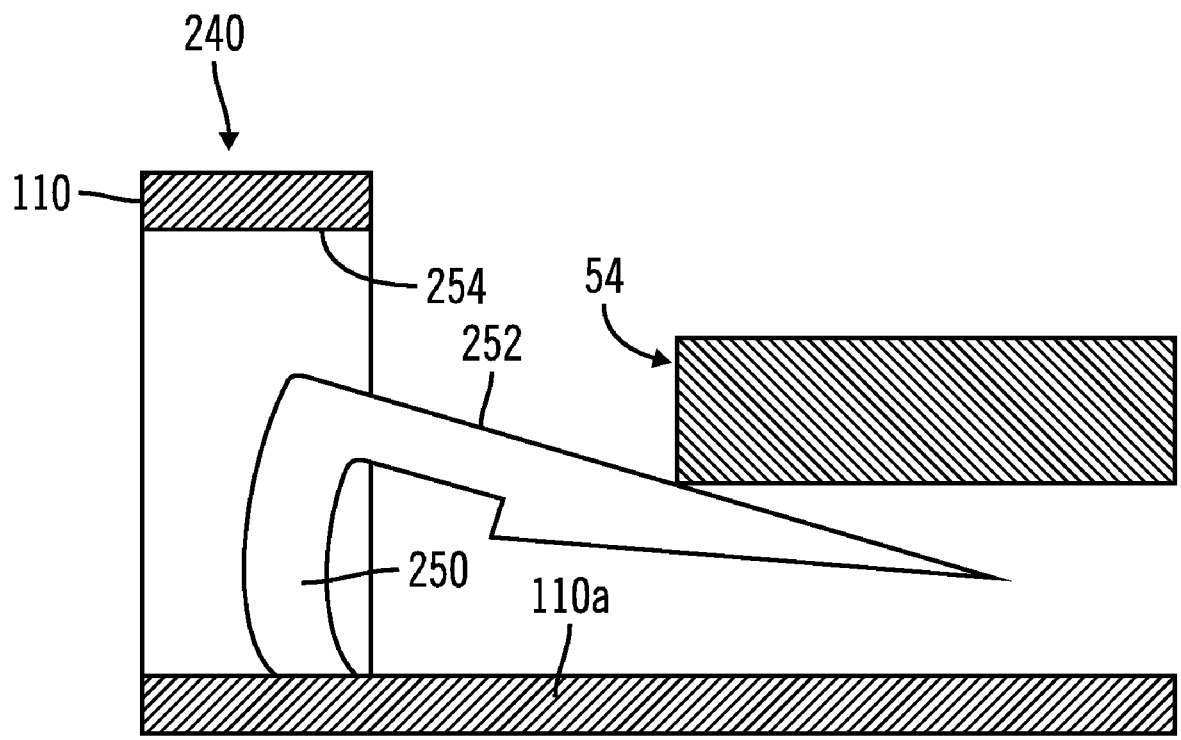
Figure 9C:
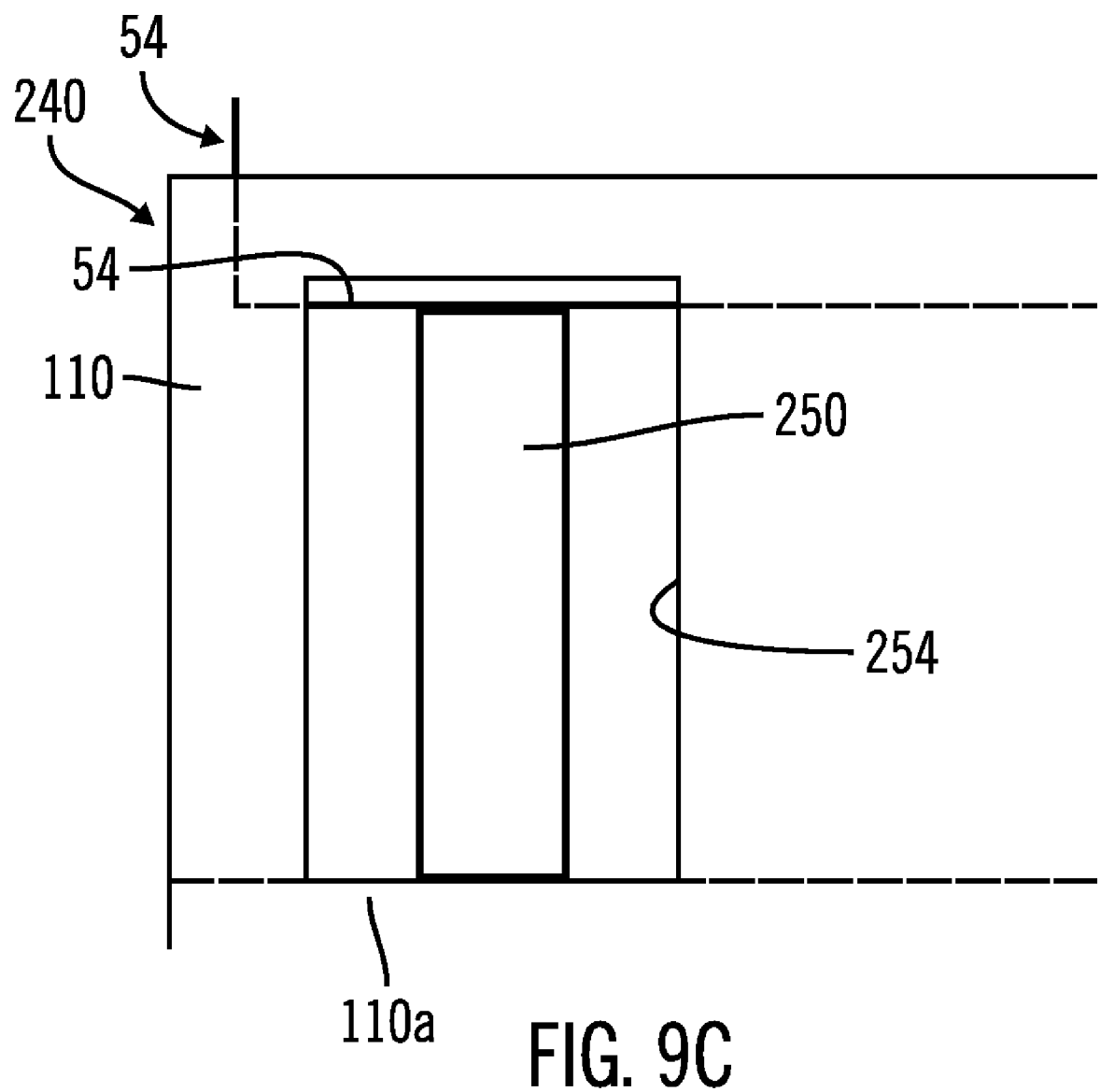

FIGS. 9a, 9b and 9c illustrate yet another embodiment of a socket 240 having a flexible connection member 250 between a standoff 252 and a socket housing 110. In this embodiment, the connection member 250 is connected at one end to the standoff 252, and at the other end to base 110a of the socket housing 110 in a first position (FIGS. 9a, 9c) similar to that illustrated in FIG. 3b. In this first position, the standoff 252 supports a package 54 in an aligned position with respect to the socket contact terminals. In this position the package contact terminals are aligned but disengaged with the socket contact terminals. A human or automated assembler may apply pressure to the package 54 causing the flexible connection member 250 to bend or deform downward in a manner similar to a living hinge. As a result, the standoff 252 may move or rotate down and the package 54 may move down to a second position as shown in FIG. 9b, in which the package contact terminals engage the socket contact terminals in a manner similar to that depicted in FIG. 3c. The connection member 250 may be recessed in an aperture 254 of the housing 110 to provide additional room for movement of the flexible member 250. In an alternative design, the connection member 250 may be frangible such that it breaks upon the application of pressure to permit the package 54 and standoff 252 to move down to the second position.

FIGS. 10a-10c and 11 show another example of operations for inserting an integrated circuit package, such as a package 354 into a socket such as the socket 356 disposed on a printed circuit board such as the motherboard 58. In this embodiment, the package 354 has a plurality of alignment members 358 depending from the bottom 132 of the package 354. Each alignment member 358 engages a corresponding alignment member 360 of the socket 356 to facilitate insertion of the package 354 into the socket 356.

Other features of the package 354 are similar to those of the package 54 of FIGS. 3a-3c and include, for example, similar contact terminals 136. Other features of the socket 356 are similar to the socket 56 of FIGS. 3a-3c. Thus, for example, disposed within the socket housing 110 of the socket 356 is an array of similar electrically conductive contact terminals 112, each of which is supported at one end by an electrically conductive base terminal 114 of the socket housing 110.

In the embodiment of FIGS. 10a-10c and 12, the alignment members 358 of the package 354 are pin-shaped male alignment members having an elongated cylindrical alignment surface 358a. Conversely, the alignment members 360 of the socket 356 are female alignment members, each of which defines an aperture having an elongated and cylindrically shaped alignment surface 360a which is adapted to receive the cylindrical alignment surface 358a of the male alignment members 358 of the package 354.

Figure 11:
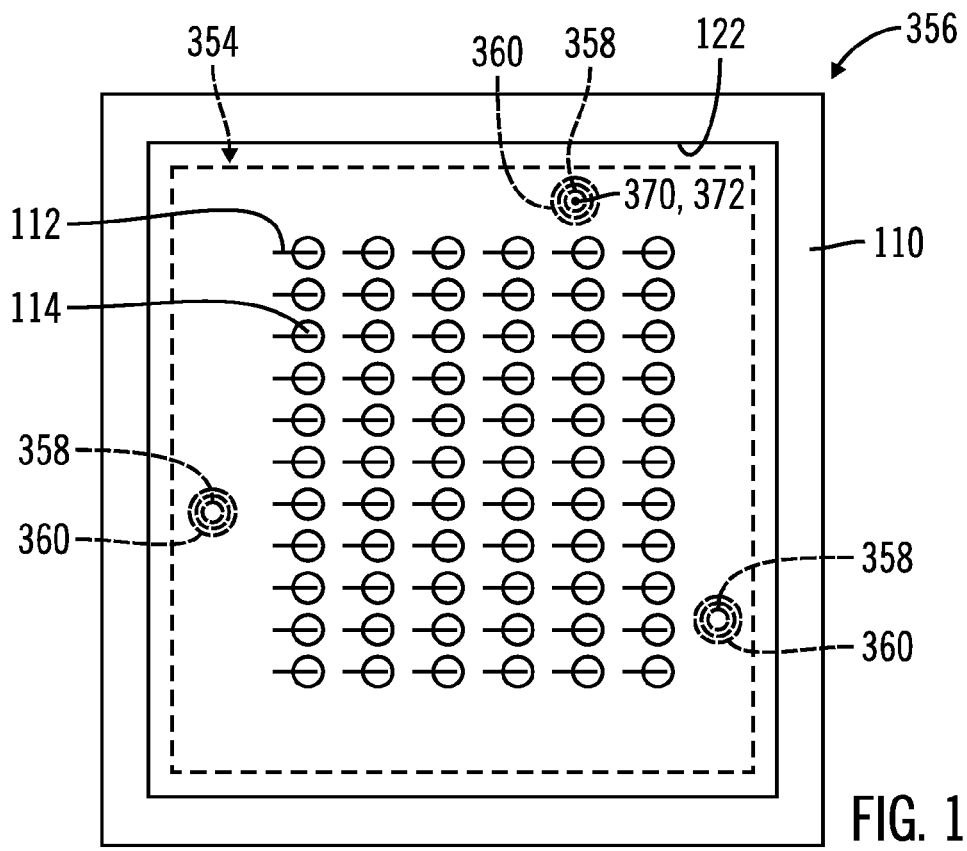
FIG. 11 is a schematic top view of a socket and package in accordance with the embodiment of FIG. 10c.

As best seen in FIG. 11, the male alignment members 358 of the package 354 are disposed asymmetrically in a triangular pattern about the exterior of the package 354. The female alignment members 360 of the socket 356 are disposed in a corresponding pattern within the housing aperture 122. It is appreciated that the alignment members 358 and 360 may be disposed in a variety of different arrangements and the number of alignment members 358 and 360 may vary, depending upon the particular application.

In the illustrated embodiment, the alignment members 358 are made of the same material as the exterior of the package 354, such as a polymer or thermoplastic. Similarly, the alignment members 360 are formed of the same material as the housing 110 such as a polymer or thermoplastic, for example. It is appreciated that the alignment members 358, 360 may be formed of a variety of other materials, either conductive or insulative, depending upon the particular application. For example, the alignment surfaces 360a may be plated with a material to provide an appropriate hardness or coefficient of friction, for example.

Figure 10A:
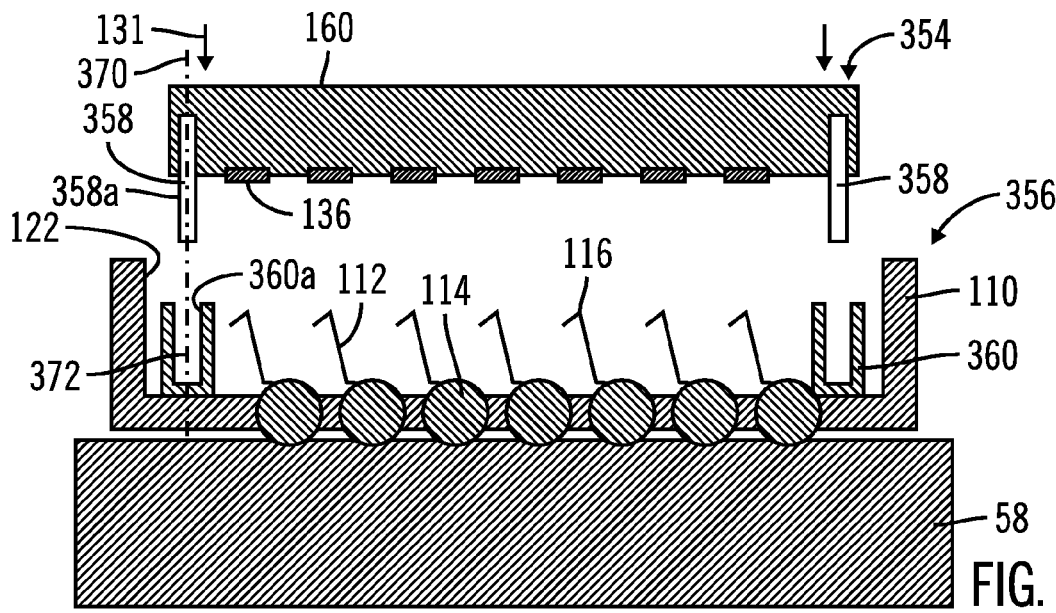
FIGS. 10a, 10b and 10c are schematic cross-sections illustrating operations in which an integrated circuit package is inserted into a socket in accordance with still another embodiment of the present disclosure.
Figure 10B:
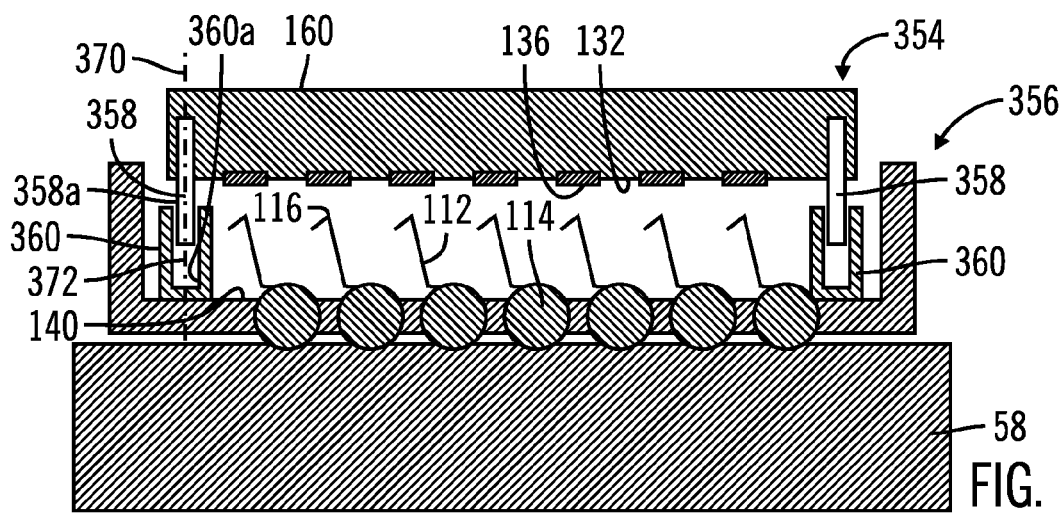

To insert an integrated circuit package such as the package 354 into the socket 356, in a first operation, the package 354 is moved toward the socket in a direction represented by arrows 131 until the alignment surface 358a of each of the male alignment members 358 begins to engage the alignment surface 360b of the female alignment members 360 as shown in FIG. 10b.

In one aspect of this embodiment of the present disclosure, the integrated circuit package 354 may be supported by the frictional engagement of the alignment members 358, 360 in this first position, such that the contact terminals 112 of the socket 356 and corresponding contact terminals 136 of the integrated circuit package 354 remain substantially disengaged. In another aspect, the alignment members 358, 360 may align the integrated circuit package 354 with respect to the socket contact terminals 112 prior to substantial contact between the socket contact terminals 112 and the package contact terminals 136. The alignment surface 358a of each male alignment member 358 defines a longitudinal axis 370 and the alignment surface 360a of each female alignment member 360 defines a longitudinal axis 372. As the package 354 is moved in a direction 131 parallel to the alignment surface axis 370 which permits the alignment surface 358a to engage the alignment surface 360a, the longitudinal axes 370, 372 can become substantially parallel and aligned.

For example, the face 132 of the integrated circuit package 354 is depicted in FIG. 10b as being relatively parallel to an opposing face 140 of the housing 110, when the package 354 is aligned by the alignment members 358, 360 in the initial aligned position. In addition, the contact terminals 136 are depicted in FIG. 10b as being substantially aligned for subsequent engagement with corresponding socket contact terminals 112 as motion of the package 354 in the direction represented by the arrows 131 continues.

As discussed in connection with the package 54, the package 354 may be placed on the socket 356 by a human or automated assembler. In one embodiment, the frictional engagement of the alignment members 358, 360 may be sufficient to support the weight of the package 354 in the first position depicted in FIG. 10b. In this manner, contact between the socket contact terminals 112 and the package contact terminals 136 may be delayed until an appropriate alignment between the package 354 and the socket 356 has been achieved.

It is appreciated that the frictional support provided by the alignment members 358, 360 may vary depending upon the particular application. For example, in one application, the alignment members 358, 360 may have sufficient frictional engagement to support the weight of the package 354 indefinitely. In another application, for example, the alignment members 358, 360 may have sufficient frictional engagement merely to delay contact between the socket contact terminals 112 and the package contact terminals 136 until an appropriate alignment between the package 354 and the socket 356 has been achieved.

Figure 10C:
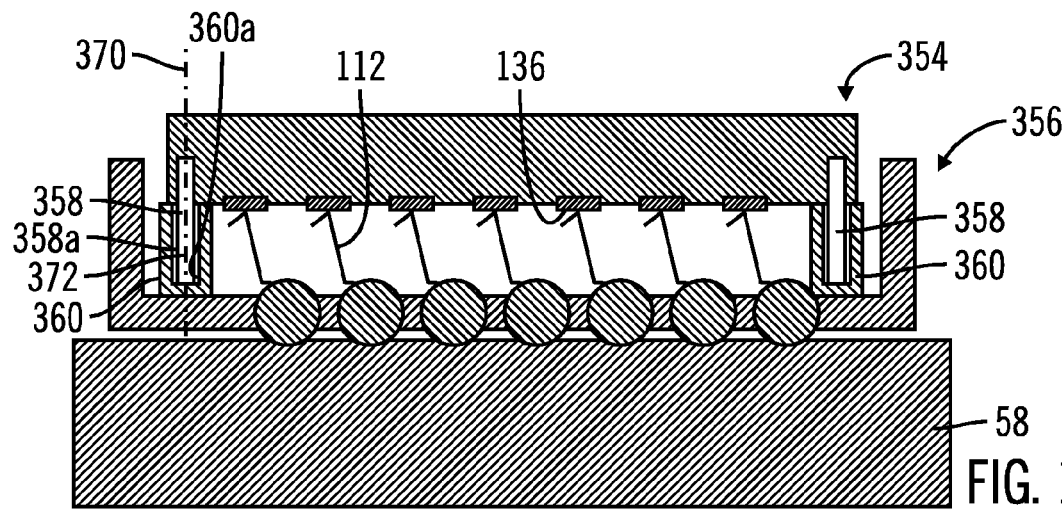

In another operation, the package 354 may be moved to a second position in which the package contact terminals 136 are engaged with the socket contact terminals 112 as shown in FIG. 10c. In the illustrated embodiment, the direction 131 of movement of the package 354 from the first position to the second standoff position is in the direction of the aligned longitudinal axes 370, 372 of the alignment members 358, 360, respectively. The package 354 may be moved to cause the package contact terminals 136 to move into contact with socket contact terminals 112 using a variety of techniques known to those skilled in the integrated circuit assembly art.

In the illustrated embodiment, the alignment surface 358a of each male alignment member 358 is continuously engaged with the alignment surface 360a of the associated female alignment member 360 as the package 354 is moved from the first position of FIG. 10b to the second position of FIG. 10c. In alternative embodiments, the alignment surfaces 358a, 360a may be discontinuous such that engagement between the alignment surface 358a and the alignment surface 360a is intermittent.

It is appreciated that the package 354 may have one or more female alignment members instead of male alignment members and the socket 356 may have one or more male alignment members instead of female alignment members. It is further appreciated that the alignment surfaces of the male and female alignment members may have a variety of cross-sectional shapes including round, oval, rectangular, square, triangular, trapezoidal, symmetrical, asymmetrical etc. It is also appreciated that the alignment surfaces may be continuous or interrupted.

In the illustrated embodiment, the male alignment members are pin-shaped. It is appreciated that the male alignment members may have shapes similar to rails, knobs, ridges and other protruding shapes, depending upon the particular application.

In the illustrated embodiment, the female alignment surfaces are cylindrical cavity-shaped. It is appreciated that the female alignment members may have shapes similar to grooves, slots, tracks or other hollow shapes, depending upon the particular application. The alignment surfaces of the male and female members may be conforming, nonconforming, interlocked, interdigitated or otherwise cooperating, depending upon the particular application.

ADDITIONAL EMBODIMENT DETAILS

In certain embodiments, the socket embodiments may be embodied in a computer system including a video controller to render information to display on a monitor coupled to a computer system comprising a desktop, workstation, server, mainframe, laptop, handheld computer, etc. Alternatively, the socket embodiments may be embodied in a computing device that does not include a video controller, such as a switch, router, etc.

The illustrated operations of FIGS. 3a-3c, 4, 7a-7c, 9a-9c and 10a-10c show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

Figure 12:
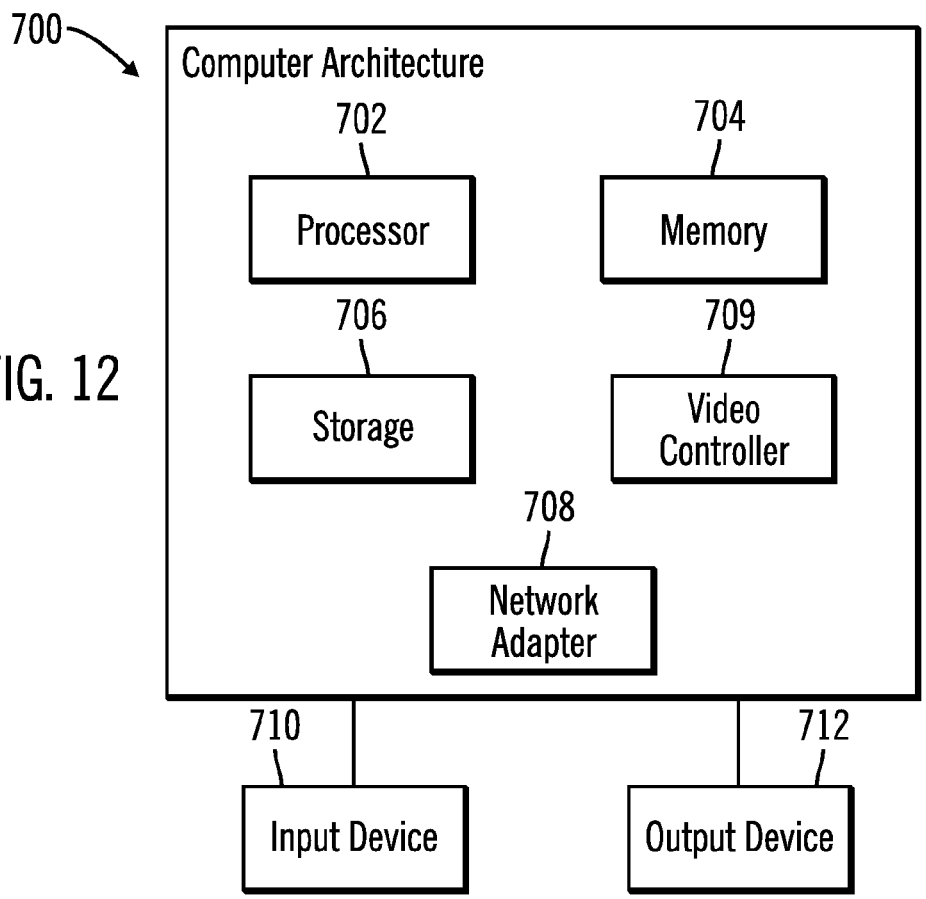
FIG. 12 illustrates an architecture that may be used with the described embodiments.

FIG. 12 illustrates one embodiment of a computer architecture 700 which can utilize components, such the devices shown in FIG. 2. One or more components or devices may utilize a socket in accordance with the description provided herein.

The architecture 700 may include a processor 702 (e.g., a microprocessor), a memory 704 (e.g., a volatile memory device), and storage 706 (e.g., a non-volatile storage, such as magnetic disk drives, optical disk drives, a tape drive, etc.). The processor 702 may be mounted on a motherboard, for example. The storage 706 may comprise an internal storage device or an attached or network accessible storage. Programs in the storage 706 are loaded into the memory 704 and executed by the processor 702 in a manner known in the art. The architecture further includes a network adapter 708 to enable communication with a network, such as an Ethernet, a Fibre Channel Arbitrated Loop, etc. Further, the architecture may, in certain embodiments, include a video controller 709 to render information on a display monitor, where the video controller 709 may be embodied on a video card or integrated on integrated circuit components mounted on the motherboard. Certain of the devices may have multiple cards or controllers. An input device 710 is used to provide user input to the processor 702, and may include a keyboard, mouse, pen-stylus, microphone, touch sensitive display screen, or any other activation or input mechanism known in the art. An output device 712 is capable of rendering information transmitted from the processor 702, or other component, such as a display monitor, printer, storage, etc.

The network adapter 708 or other devices described herein may be mounted on an expansion card, such as a Peripheral Component Interconnect (PCI) card, PCI-express or some other I/O expansion card coupled to a motherboard, or on integrated circuit components mounted on the motherboard. Devices may be mounted directly to a card or may utilize a socket in accordance with the description provided herein. Thus, package or socket embodiments may be embodied in computer systems or other systems in which a package or socket in accordance with the present description is mounted on one or both of a motherboard and an expansion card. Accordingly, in some system embodiments, the system may lack an expansion card, and a package or socket in accordance with the present description may be mounted on a motherboard. In another system embodiment, a package socket in accordance with the present description may be mounted on an expansion card but not on a motherboard.

Details on the PCI architecture are described in "PCI Local Bus, Rev. 2.3", published by the PCI-SIG. Details on the Fibre Channel architecture are described in the technology specification "Fibre Channel Framing and Signaling Interface", document no. ISO/IEC AWI 14165-25. Details on the Ethernet protocol are described in publications including "IEEE std. 802.3," published Mar. 8, 2002, and "IEEE std. 802.11," published 1999-2003.

The foregoing description of various embodiments has been presented for the purposes of illustration and description. It is not intended to be exhaustive or to limit to the precise form disclosed. Many modifications and variations are possible in light of the above teaching.

What is claimed is:

1. A device, comprising:
a plurality of alignment supports, each alignment support including at least one of a male alignment member and a female alignment member;
a package containing an integrated circuit, said package having a plurality of land contact terminals and a plurality of said alignment members depending from said package; and
a socket having a plurality of leaf spring contact terminals and a plurality of said alignment members, wherein said female alignment members of each alignment support are positioned to be frictionally engaged by an associated male alignment member of said alignment supports as said package is moved from a first aligned position in which said frictional engagement between said male alignment members and said female alignment members of said supports is sufficient to support said package in said first aligned position so that said package contact terminals are disengaged from said socket contact terminals in said first aligned position, to a second aligned position in which said package contact terminals are engaged with said socket contact terminals.

2. The device of claim 1 wherein said female alignment member defines a longitudinal axis and said male alignment member defines a longitudinal axis aligned with said female alignment member longitudinal axis as said package is moved from said first position to said second position.

3. The device of claim 2 wherein said female alignment member defines a cylindrically-shaped alignment surface.

4. The device of claim 3 wherein said male alignment member is a pin which defines a cylindrically-shaped alignment surface adapted to be received by said cylindrically-shaped alignment surface of said female alignment member.

5. The device of claim 4 wherein said package has a plurality of male alignment members, each of which is a pin, and said socket has a plurality of female alignment members, each of which has a cylindrically-shaped alignment surface adapted to receive a male alignment member.

6. The device of claim 5 wherein said male and female alignment members are adapted to be continuously engaged with each other to continuously align said package contact terminals with respect to said socket contact terminals as said package is moved from said first aligned position to said second aligned position.

7. A method, comprising:
inserting a package containing an integrated circuit into a socket, said inserting including:
frictionally engaging a plurality of male alignment members of a plurality of alignment supports of at least one of said socket and said package with a plurality of female alignment members of a plurality of said alignment supports of the other of said socket and said package, to align package land contact terminals to socket leaf spring contact terminals at a first aligned position of said package wherein said frictional engagement between male alignment members and female alignment members of said plurality of alignment supports is sufficient to support said package in said first aligned position so that said contact terminals of said package are disengaged from said contact terminals of said socket in said first aligned position; and
moving said package with said package contact terminals aligned with respect to said socket contact terminals by said engaged male and female alignment members to a second position in which said package contact terminals are engaged with said socket contact terminals.

8. The method of claim 7 wherein said package has a plurality of male alignment members, each of which is a pin, and said socket has a plurality of female alignment members, each of which has a cylindrically-shaped alignment surface adapted to receive a male alignment member.

9. The method of claim 8 wherein said male and female alignment members are continuously engaged with each other to continuously align said package contact terminals with respect to said socket contact terminals as said package is moved from said first aligned position to said second aligned position.

10. A socket for a package containing an integrated circuit, said package having a plurality of contact terminals, comprising:
- a socket housing;
- a plurality of leaf spring contact terminals within said housing; and
- at least one of a male alignment member and a female alignment member of an alignment support of a plurality of alignment supports positioned to be frictionally engaged by at least one of the other of the male alignment member and the female alignment member of the package, as said package is moved from a first aligned position in which said frictional engagement between male alignment members and female alignment members of said plurality of alignment supports is sufficient to support said package in said first aligned position so that said package contact terminals are disengaged from said socket contact terminals in said first aligned position, to a second aligned position in which said package contact terminals are engaged with said socket contact terminals.

11. The socket of claim 10 wherein said package has a plurality of male alignment members, each of which is a pin, and said socket has a plurality of female alignment members, each of which has a cylindrically-shaped alignment surface adapted to receive a male alignment member.

12. A system, comprising:
- at least one system memory;
- a plurality of alignment supports, each alignment support including at least one of a male alignment member and a female alignment member;
- a package containing an integrated circuit, said package having a plurality of land contact terminals and a plurality of said alignment members depending from said package;
- a motherboard electrically coupled to said memory; and
- a socket electrically coupling said package to said motherboard, said socket having a plurality of leaf spring contact terminals and a plurality of said alignment members, wherein said female alignment members of each alignment support are positioned to be frictionally engaged by an associated male alignment member of said alignment supports as said package is moved from a first aligned position in which said frictional engagement between said male alignment members and said female alignment members of said supports is sufficient to support said package in said first aligned position so that said package contact terminals are disengaged from said socket contact terminals in said first aligned position, to a second aligned position in which said package contact terminals are engaged with said socket contact terminals;
- an expansion card coupled to said motherboard; and
- a controller mounted on said expansion card.

13. The system of claim 12 wherein said package has a plurality of male alignment members, each of which is a pin, and said socket has a plurality of female alignment members, each of which has a cylindrically-shaped alignment surface adapted to receive a male alignment member.

14. The system of claim 13 wherein said male and female alignment members are adapted to be continuously engaged with each other to continuously align said package contact terminals with respect to said socket contact terminals as said package is moved from said first aligned position to said second aligned position.

15. An integrated circuit device for a socket having a plurality of leaf spring contact terminals, comprising:
- a package having an integrated circuit;
- a plurality of land contact terminals depending from said package; and
- at least one of a male alignment member and a female alignment member of an alignment support of a plurality of alignment supports disposed on said package and positioned to be frictionally engaged by at least one of the other of the male alignment member and the female alignment member of the socket, as said package is moved from a first aligned position in which said frictional engagement between male alignment members and female alignment members of said plurality of alignment supports is sufficient to support said package in said first aligned position so that said package contact terminals are disengaged from said socket contact terminals in said first aligned position, to a second aligned position in which said package contact terminals are engaged with said socket contact terminals wherein said package and socket are aligned with respect to each other by said engaged male and female alignment members.

16. The device of claim 15 wherein said package has a plurality of male alignment members, each of which is a pin.

* * * * *